United States Patent
Takamatsu

(10) Patent No.: US 8,351,002 B2
(45) Date of Patent: Jan. 8, 2013

(54) PRINTED CIRCUIT BOARD AND METHOD FOR MANUFACTURING THE SAME

(75) Inventor: Ryujiro Takamatsu, Ishikawa-ken (JP)

(73) Assignee: Japan Display Central Inc., Fukaya-shi (JP)

( * ) Notice: Subject to any disclaimer, the term of this patent is extended or adjusted under 35 U.S.C. 154(b) by 614 days.

(21) Appl. No.: 12/505,132

(22) Filed: Jul. 17, 2009

(65) Prior Publication Data

US 2010/0014035 A1 Jan. 21, 2010

(30) Foreign Application Priority Data

Jul. 17, 2008 (JP) ................................. 2008-186264

(51) Int. Cl.
*G02F 1/1345* (2006.01)

(52) U.S. Cl. ......... 349/122; 349/150; 174/261; 174/266

(58) Field of Classification Search ........................ None
See application file for complete search history.

(56) References Cited

FOREIGN PATENT DOCUMENTS

| JP | 2003-29650 | 1/2003 |
| JP | 2004-104037 | 4/2004 |

OTHER PUBLICATIONS

Decision of Refusal issued Mar. 1, 2011 in Japanese Patent Application No. 2008-186264 (English translation only).

*Primary Examiner* — Richard Kim
(74) *Attorney, Agent, or Firm* — Oblon, Spivak, McClelland, Maier & Neustadt, L.L.P.

(57) ABSTRACT

A printed circuit board for mounting electronic parts thereon includes a ground portion formed on the printed circuit board and connected to an outer ground. A plurality of conductive ground layers are stacked so as to interpose an insulation layer therebetween. An upper conductive ground layer includes first and second conductive ground portions. The first and second ground portions are connected by a connecting element. Another conductive ground layer under the upper conductive ground layer is grounded via the first and second ground portions of the upper conductive ground layer via a through hole provided in the ground portion.

5 Claims, 3 Drawing Sheets

PRINTED CIRCUIT BOARD AND METHOD FOR MANUFACTURING THE SAME

CROSS-REFERENCE TO RELATED APPLICATIONS

This application is based upon and claims the benefit of priority from prior Japanese Patent Application No. 2008-186264, filed Jul. 17, 2008, the entire contents of which are incorporated herein by reference.

BACKGROUND OF THE INVENTION

1. Field of the Invention

The present invention relates to a printed circuit board and method for manufacturing the same, in which a ground construction of the printed circuit board can be selected based on wiring patterns and electric parts installed on the printed circuit board.

2. Description of the Background Art

As a typical flat display panel, a liquid crystal display device of an active matrix type is widely used. The liquid crystal display device includes a circuit board connected to the liquid crystal display panel via a connector such as a flexible substrate.

The circuit board is, for example, a printed circuit board (PCB) in which a plurality of conductive ground layers (traces) are laminated with interposing insulation layers. The printed circuit board is provided with a ground portion at its corner where the ground layers contained in respective multi layers are connected to an outer ground. The ground layers are often connected to the outer ground by a screw to fix the printed circuit board with an outer case of the display. However, the ground layers are sometimes separated from signal lines such as gate layers to avoid unfavorable electro-static action (i.e., are in a floating condition).

A printed circuit board having multi-conductive layers has been proposed in Japanese patent application 2004-104037, in which a ground connection using a shortest route from any location on the printed circuit board is described.

As described-above, in the case the printed circuit board is connected to the outer ground by a screw, noises from the outer ground may spread to the plurality of conductive ground layers in the printed circuit board through the screw. It is desirable for the noises from the outer ground to the printed circuit board to spread, for example, to the plurality of conductive ground layers in the printed circuit board through an appropriate route corresponding to a wiring pattern layout and types of electric elements installed on the printed circuit board.

However, the appropriate designing of the ground construction, which fits to a combination of the wiring pattern in the printed circuit board and the outer ground is accompanied with some difficulties in a first designing step. That is, it is difficult to determine whether the plurality of conductive ground layers should be set at a floating condition or be connected to the outer ground through the screw. Accordingly, the influence to a circuit operation of the printed circuit board by noises such as an electro-static noise, that spreads from the ground construction, becomes significant after installing the printed circuit board into the liquid crystal display device.

BRIEF SUMMARY OF THE INVENTION

The present invention has been made to address the above-mentioned and other problems.

To that end, according to one exemplary aspect of the invention, a printed circuit board for mounting electronic parts thereon, includes: a ground portion formed on the printed circuit board, the ground portion being connected to an outer ground; first and second conductive ground layers stacked so as to interpose an insulation layer therebetween, the first conductive ground layer including first and second conductive ground portions; and a connecting element to connect the first and second conductive ground portions; wherein the first conductive ground portion is coupled to the outer ground and the second conductive ground layer is grounded via the first and second ground portions of the first conductive ground layer.

According to another exemplary aspect of the invention, a method for manufacturing a printed circuit board includes: (a) forming a ground portion on the printed circuit board coupled to an outer ground; (b) forming first and second conductive ground layers stacked so as to interpose an insulation layer therebetween, the first conductive ground layer including a first conductive ground portion having an island shape and the second conductive ground portion being adjacent to the first conductive ground portion; and (c) forming first and second through holes provided to the first and second conductive ground portions, respectively, to electrically couple the first and second conductive ground portions to the second conductive ground layer; wherein more than two connecting elements are provided between the first and second conductive ground portions so as to electrically couple the first and second conductive ground portions, wherein the numbers of the connecting elements and locations where the connecting elements are arranged are determined by characteristics of circuit elements installed on the printed circuit board and a pattern of wiring formed on the printed circuit board, and wherein the first conductive ground portion is coupled to the outer ground and the second conductive grounded layer is grounded via the first and second ground portions of the first conductive ground layer.

The specific nature of the invention as well as other objects, features, advantages, and uses thereof will become evident from the following description of a preferred embodiment along with the accompanying drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF PREFERRED EMBODIMENTS

Figure 1:
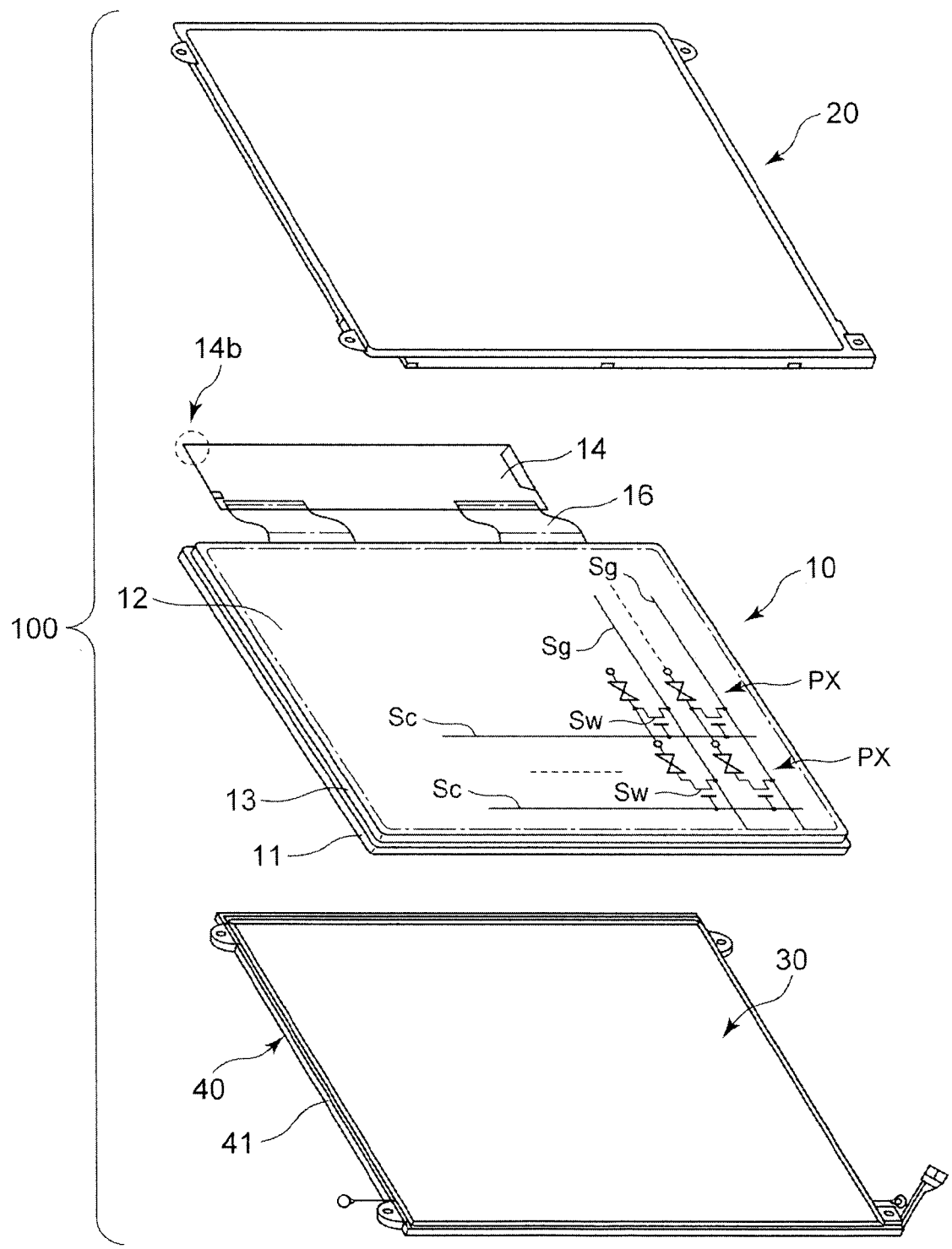
FIG. 1 is a view showing a liquid crystal display device using a printed circuit board according to an embodiment of this invention.

A printed circuit board according to an exemplary embodiment of the present invention, in particular, a ground construction which is selected corresponding to patterns of wirings and electric elements, and a method for manufacturing the same, will now be described with reference to the accompanying drawings wherein the same or like reference numerals designate the same or corresponding parts throughout the several views.

Hereinafter, a liquid crystal display device according to an embodiment of the invention and the printed circuit board used in the liquid crystal display device will be explained with reference to the drawings. FIG. 1 is a partially exploded perspective view showing a liquid crystal display device 100 according to one exemplary embodiment of the invention. The liquid crystal display device 100 includes a rectangular liquid crystal display panel 10, a flat light source 30 for illuminating the liquid crystal display panel 10 from a rear side, a frame 40 for supporting the liquid crystal display panel 10 and the flat light source 30, and a vessel cover 20 fixed to the frame 40 for supporting a peripheral portion of the liquid crystal display panel 10.

The liquid crystal display panel 10 includes an array substrate 11 and a counter substrate 13. A liquid crystal layer is held between the array substrate 11 and the counter substrate 13. Polarizers (not shown) are arranged on outer surfaces of the array substrate 11 and the counter substrate 13, respectively.

The liquid crystal display panel 10 includes a display area 12 for displaying images. In the display area 12, the array substrate 11 includes a picture electrode (not shown) arranged in the respective pixels PX, a plurality of scanning lines Sc extending in a row direction, a plurality of signal lines Sg extending in a column direction, and switching transistors arranged for each pixel near regions where the scanning lines Sc intersect with the signal lines Sg.

The switching element SW is, for example, formed of a thin film transistor (TFT) having a poly-silicon layer. A gate electrode and a source electrode are connected to the associated scanning lines Sc and the signal lines Sg, respectively. A source to drain path connects the corresponding signal line Sg and the picture electrode.

The counter substrate 12 includes a counter electrode (not shown) facing a plurality of picture electrodes interposing the liquid crystal layer. The counter electrode is driven by a counter electrode driving circuit (not shown) that supplies a predetermined voltage.

The scanning line Sc is successively driven by a scanning line driving circuit (not shown), in which the scanning signals to switch on or switch off the switching elements are supplied to the scanning line Sc. The signal lines Sg are driven by a signal line driving circuit (not shown) that supplies predetermined image signals.

The array substrate 11 and the counter substrate 13 are arranged so that picture electrodes of all pixels PX and the counter electrode face and maintain a gap therebetween. The liquid crystal layer composed of liquid crystal material is contained in the gap.

When a scanning signal to switch on the switching elements SW is applied to the selected signal line Sc, a source to drain pass of the switching elements SW connected to the selected scanning line Sc is rendered conductive and image signals are supplied to the picture electrodes from the selected signal lines Sg. An alignment of the liquid crystal molecules contained in the liquid crystal layer is controlled by a voltage difference between the image signals supplied to the picture electrode and a counter voltage supplied to the counter electrode.

A printed circuit board 14 of rectangular shape to supply driving signals to the pixels PX is electrically connected to one edge of the liquid crystal display panel 10 through a flexible substrate 16. The printed circuit board 14 includes a ground portion 14b located at its corner.

Figures 2A, 2B, 2C:
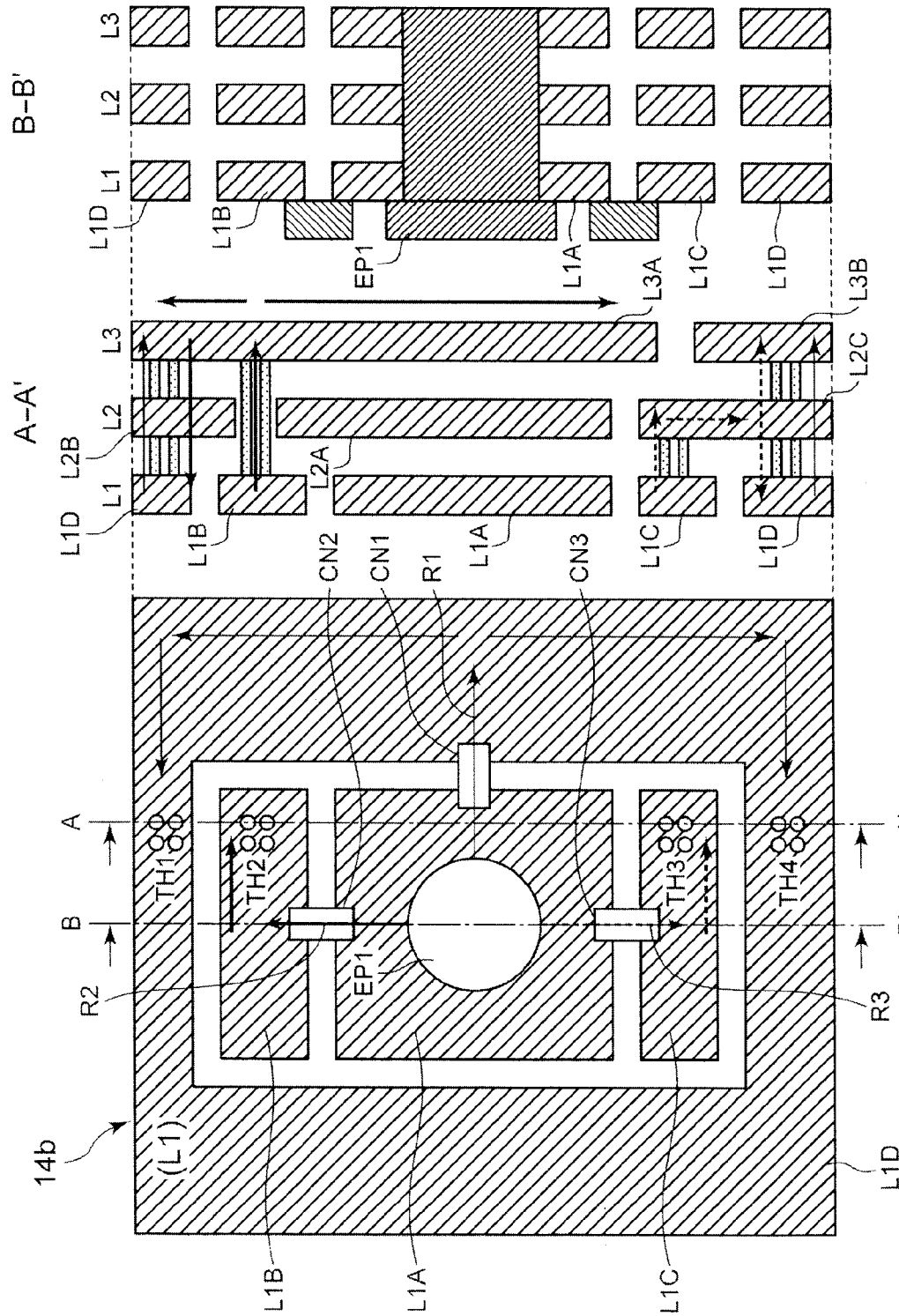
FIGS. 2(*a*)-2(*c*) are views of one embodiment of the printed circuit board used in the liquid crystal display device shown in FIG. 1.

FIGS. 2(a)-2(c) show a first embodiment of the present invention, in which FIG. 2(a) shows the ground portion 14b from FIG. 1, FIG. 2(b) is a cross-section along the line A-A' in FIG. 2(a), and FIG. 2(c) is a cross-sectional view along the line B-B' in FIG. 2(a). As shown in FIGS. 2(a)-2(c), the ground portion 14b of the printed circuit board 14 includes a plurality of conductive ground layers L1, L2 and L3 stacked, with interposing insulation layers made of thermoplastic resin such as an epoxy glass layer or a polyimide layer therebetween. The printed circuit board 14 includes a screw EP1 arranged at the ground portion 14b so as to penetrate the stacked plurality of conductive ground layers L1, L2 and L3. The printed circuit board 14 is grounded by connecting an outside case of the display and the screw EP1 arranged at the ground portion 14b. That is, the connection to an outer ground is made via the screw EP1.

The conductive ground layer L1 is arranged on an upper surface of the printed circuit board 14. The conductive ground layer L1 includes a substantially rectangular conductive ground portion L1A, conductive ground portions L1B and L1C arranged on both sides of the conductive ground portion L1A in a direction extending along a line A-A', and a conductive ground portion L1D surrounding the conductive ground portions L1A, L1B and L1C.

In the cross-sectional view taken along line A-A' in FIG. 2(a), which is shown in FIG. 2(b), the conductive ground layer L2 includes three conductive ground portions L2A, L2B and L2C. The conductive ground portions L2A and L2B are arranged so as to face the conductive ground portions L1A and L1D, respectively. Conductive portion L2A also faces a small portion of conductive ground portion L1B. The conductive ground portion L2C faces the conductive ground portions L1C and L1D. The conductive ground portion L3 includes two conductive ground portions L3A and L3B. The conductive ground portion L3A is arranged so as to face the conductive ground portions L1A and L1B and L1D. Conductive portion L3A also faces a small portion of conductive ground portion L1C. The conductive ground portion L3B is arranged so as to face the conductive ground portion L1D. Conductive portion L3A also faces a small portion of conductive ground portion L2C.

A hole to fit the screw EP1 is formed in the conductive ground portion L1A. Further, four sets of four through holes TH1 to TH4 are provided in the conductive ground portions L1B, L1C and L1D so as to connect the conductive ground layer L1 and at least one of the conductive ground layers L2 and L3. The through hole sets TH1 to TH2 could be formed as single through holes or sets of a different number than four through holes.

A conductive material such as copper is coated or injected in the through hole sets TH1 to TH4. The through hole sets TH1 and TH4 are provided at both edge portions of the conductive ground portion L1D in the extending direction of line A-A'. The through hole set TH1 is formed so as to penetrate the conductive ground portion L2B and extend to conductive ground portion L3A. Accordingly, the conductive ground layers L1, L2 and L3 are electrically connected to each other by the conductive material provided in the contact through hole set TH1.

The through hole set TH2 is provided in the conductive ground portion L1B. Since the conductive ground layer L2 is removed at a region where the contact through hole set TH2 is made, the conductive ground layers L1 and L3 are electrically connected by the conductive material provided to the contact through hole set TH2. In this embodiment, the same conductive material, e.g. copper as the conductive ground layers L1, L2 and L3, may be used for the contact through hole set TH2, however, another conductive material such as nickel may be used.

The through hole set TH3 is provided in the conductive ground portion L1C. Since, the lower conductive ground layer L3 is removed at a region where the through hole TH3 is made, only conductive ground layers L1 and L2 are electrically connected by the conductive material provided to the contact through hole set TH3.

The through hole set TH4 is provided in the conductive ground portion L1D at an opposite end region to the through hole set TH1. The through hole set TH4 is formed so as to penetrate the conductive ground portion L2C in layer L2 and extend to conductive ground portion L3B in layer L3. Accordingly, the conductive ground layers L1, L2 and L3 are electrically connected to each other by the conductive material provided in the contact through hole set TH4.

In the exemplary embodiment of the present invention as shown in FIGS. 2(a)-2(c), additionally connecting elements CN1, CN2, and CN3 can be provided. Not each of those connecting elements CN1, CN2, and CN3 need be provided, but any one or all three of those connecting elements can be provided.

In the exemplary embodiment of the present invention of FIG. 1, determining which ones of connecting elements CN1, CN2, and CN3 to be provided and to thereby include in the ground portion 14b can be made after circuit elements are installed on the printed circuit board 14. That is, the type of circuit elements and the positioning of the circuit elements on the printed circuit board 14 can influence the effect of noises supplied to the printed circuit board 14. As discussed in further detail below, by providing one or all of the connecting elements CN1, CN2, and CN3, paths can be created to spread out or suppress noises supplied to the printed circuit board 14. In the exemplary embodiment of the present invention noted above, by selecting which the connecting elements CN1, CN2, CN3 to implement, the spreading out and suppressing of the noises can be optimized, as now discussed further below.

In the case the conductive ground portion L1A of the conductive ground layer L1 and the conductive ground portion L1D are connected by a connecting element CN1 made of a conductive material such as copper or nickel, the noise from the outside of the display via the screw EP1 spreads to the plurality of conductive ground layers L1, L2 and L3 as shown by an arrow R1. That is, the noise spreads to the conductive ground portion L1A from the screw EP1, then to the conductive ground portion L1D via the first connecting element CN1. Further, the noise spreads to the conductive ground layers L2 and L3 via through hole sets TH1 and TH4.

In the case the conductive ground portion L1A of the conductive ground layer L1 and the conductive ground portion L1B are connected by a connecting element CN2 made of a conductive material such as copper or nickel, the noise from the outside of the display via the screw EP1 spreads to the plurality of conductive ground layers L1, L2 and L3 as shown by an arrow R2. That is, the noise spreads to the conductive ground portion L1A from the screw EP1, then to the conductive ground portion L1B via the second connecting element CN2. Further, the noise spreads to the conductive ground portion L3A of the conductive ground layer L3 via the through hole set TH2. The noise spreads to the entire direction in the conductive ground portion L3A and reaches to the first contact hole TH1. The noise spreads to the conductive ground portion L2B of the conductive ground layer L2 and the conductive ground portion L1D of the conductive ground layer L1 via the first contact through hole set TH1.

In the case the conductive ground portion L1A of the conductive ground layer L1 and the conductive ground portion L1C are connected by a connecting element CN3 made of a conductive material such as copper or nickel, the noise from the outside of the display via the screw EP1 spreads to the plurality of conductive ground layers L1, L2 and L3 as shown by an arrow R3. That is, the noise spreads to the conductive ground portion L1A from the screw EP1, then to the conductive ground portion L1C via the third connecting element CN3. Further, the noise spreads to the conductive ground portion L2C of the conductive ground layer L2 via the through hole set TH3. The noise spreads to the entire direction in the conductive ground portion L2C and reaches to the contact through hole set TH4. The noise spreads to the conductive ground portion L1D of the conductive ground layer L1 and the conductive ground portion L3B of the conductive ground layer L3 via the contact through hole set TH4.

As mentioned-above, according to this embodiment, it becomes possible to select at least one of the spreading routes R1, R2 and R3 of the electro-static noises supplied from the outside of the display to the ground portion 14b in the printed circuit board 14. That is, the embodiment adopts such a construction that the ground portion connected to the outside ground is not directly connected to all ground layers in the printed circuit board 14 but is first connected to the conductive ground layers L1, L2 and L3 selectively and then coupled to the entire ground layers.

That is, the ground construction can be changed by selecting which of the connecting elements CN1, CN2 and CN3 to implement. Accordingly, by determining which ones of connecting elements CN1, CN2 and/or CN3 to implement, it becomes possible to select any one of different ways of directly coupling the ground portion to a main ground layer or first coupling the ground portion to other ground layers bypassing and then finally coupling to all ground layers, corresponding to the arrangement of the ICs or other electric elements installed on the printed circuit board 14.

An effect on the printed circuit board 14 by noises depends on an electric characteristic, a resistance characteristic against noises, and the arrangement of circuit elements installed in the printed circuit board 14. Therefore, the noise spreading routes may optimally have to be changed corresponding to the above factors such as the electric characteristic of the electric elements and so on.

According to this embodiment, a counter measure to the noises is realized by attenuating the noises supplied to the printed circuit board 14 corresponding to the circuit elements and their arrangements. For example, the ground noises can be substantially synchronized or made asynchronous with signal noises so as to suppress the influence of the noises.

In the case the effect by noises to the electric elements such as ICs installed on the surface of the printed circuit board 14 needs to be minimized, it becomes possible to suppress the influence by selecting the connecting elements, that is, by selecting the noise spreading routes in the printed circuit board 14. As one example, the noises supplied from the outer ground is not directly supplied to the upper ground layer but is supplied to the upper ground layer again after being bypassed to other ground layers.

In the early stage of designing the display, it is difficult to determine how to design the noise spreading routes. However, as mentioned-above, the effect to the printed circuit board 14 by the noises may be suppressed by selecting an appropriate route among multiple routes; that is, by selectively providing connecting elements CN1, CN2 and CN3 in the ground portion 14b. In this embodiment, the noise spreading routes may be easily changeable by selectively implementing one or plural of the connecting elements CN1, CN2 and CN3 after examining actual effect of the noises.

According to this embodiment of the invention, it becomes possible to suppress the effect of noises supplied to the printed circuit board 14 regardless of the outer ground and the arrangement of the circuit elements installed on the printed circuit board 14. Therefore, the general versatility of the printed circuit board 14 for the display is increased and a higher manufacturing yield may be achieved.

Further, according to this embodiment of the invention, a printed circuit board 14 and a display device using the same, in which an appropriate ground construction may be selected according to the arrangement of the circuit elements in the printed circuit board 14, are provided.

A second exemplary embodiment according to the invention will now be described with reference to FIG. 3, in which the same or like reference numerals designate the same or corresponding parts.

The printed circuit board 14 according to this embodiment is applied to a liquid crystal display device such as in the first embodiment shown in FIG. 1

The liquid crystal display device 100 includes a rectangular liquid crystal display panel 10, a flat light source 30 for illuminating the liquid crystal display panel 10 from a rear side, a frame 40 for supporting the liquid crystal display panel 10 and the flat light source 30, and a vessel cover 20 fixed to the frame 40 for supporting a peripheral portion of the liquid crystal display panel 10.

The printed circuit board 14 of rectangular shape to supply driving signals to pixels PX is electrically connected to one edge of the liquid crystal display panel 10 through the flexible substrate 16. The printed circuit board 14 includes a ground portion 14b located at its corner.

Figures 3A, 3B, 3C:
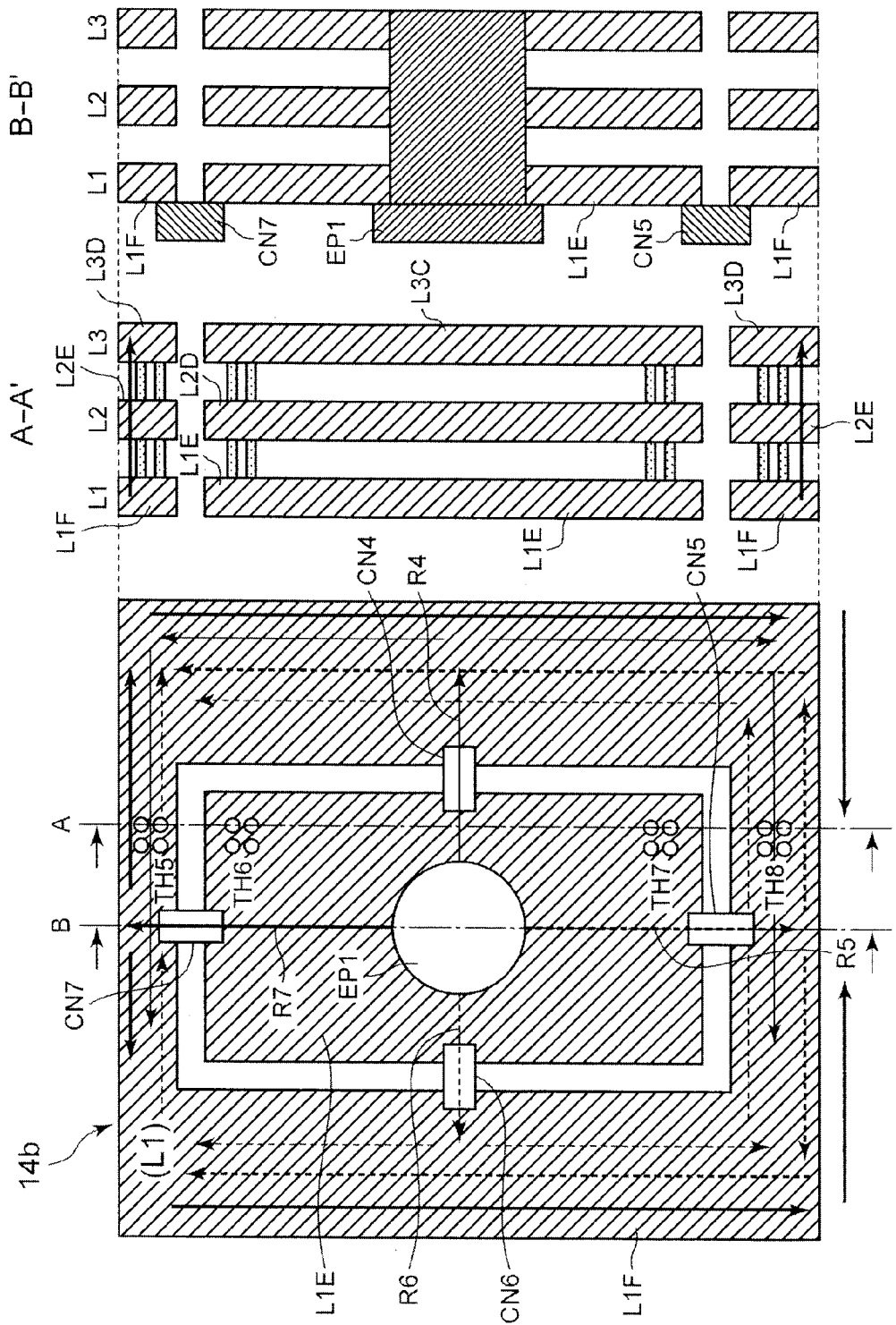
FIGS. 3(*a*)-3(*c*) are views of another embodiment of the printed circuit board used in the liquid crystal display device shown in FIG. 1.

As shown in FIG. 3, the ground portion 14b of printed circuit board 14 includes a plurality of conductive ground layers L1, L2, L3 stacked and with interposing insulative layers made of thermoplastic resin such as an epoxy glass layer or a polyimide layer therebetween. The printed circuit board includes a screw EP1 arranged at the ground portion 14b so as to penetrate the stacked plurality of conductive ground layers L1, L2, L3. The conductive ground layer L1 is arranged on an upper side surface of the printed circuit board 14. The conductive ground layer L1 having a substantially rectangular shape includes a conductive ground portion L1E of an island shape and a conductive ground portion L1F surrounding the conductive ground portion L1F. The conductive ground layer L2 includes two conductive ground portions L2E facing L1F and one central conductive ground portion L2D facing L1E, respectively. The conductive ground layer L3 includes two conductive ground portions L3D facing L1F and L2E, and one central conductive ground portion L3C facing the conductive ground portions L1E and L2D, respectively.

In the conductive ground portion L1E, a hole to fit a screw EP1 and two through hole sets TH6 and TH7 to connect the conductive ground portion L1E to the conductive ground layers L2 and L3 are provided. The through hole sets TH6 and TH7 are arranged at the opposite end portions of the conductive ground portion L1E in a direction extending along line A-A', respectively. Further, two through hole sets TH5 and TH8 to connect the conductive ground portion L1F to the conductive ground layers L2 and L3 are provided in the conductive ground layer L1F. The through hole sets TH5 and TH8 are arranged at the opposite end portions of the conductive ground portion L1F in a direction extending along line A-A', respectively.

In the through hole sets TH5 to TH8, a conductive material such as copper or nickel is provided. The conductive material may be different from the conductive ground layers L1 to L3. The through hole sets TH5 and TH8 are formed so as to penetrate the conductive ground portion L2E of the conductive ground layer L2 and extend to the conductive ground portions L3D in the conductive ground layer L3. The conductive ground portion L1F of the conductive ground layer L1 is thereby connected to the conductive ground portions to L2E and L3D. The through hole sets TH6 and TH7 are formed so as to penetrate the conductive ground portion L2D of the conductive ground layer L2 and extend to the conductive ground portion L3C of the conductive ground layer L3. The conductive ground portion L1E of the conductive ground layer L1 is thereby connected to the conductive ground portions L2D and L3C by through hole sets TH6 and TH7.

In the case the conductive ground portion L1E and the conductive ground portion L1F are connected by a connecting element CN4, noises supplied from outside of the display through the screw EP1 to the printed circuit board 14 spread to the plurality of conductive ground layers L1 to L3 through routes as shown by an arrow R4. That is, the noises from the screw EP1 spread to the conductive ground portion L1E and further spread to the conductive ground portion L1F via the connecting element CN4. Then, the noises spread in opposite directions along line A-A' extending to both edge portions of the conductive ground portion L1F. In the process of noise spreading like this, the noises further spread to other conductive ground layers L2 and L3 via the through hole sets TH5 to TH8.

In the case the conductive ground portion L1E and the conductive ground portion L1F are connected by a connecting element CN5, noises supplied from outside of the display through the screw EP1 to the printed circuit board 14 spread to the plurality of conductive ground layers L1 to L3 through routes as shown by an arrow R5. That is, the noises from the screw EP1 spread to the conductive ground portion L1E and further spread to the conductive ground portion L1F via the connecting element CN5. Then, the noises spread in opposite directions along an orthogonal line with respect to line A-A' extending to other edge portions of the conductive ground portion L1F. In the process of noise spreading like this, the noises further spread to the other conductive ground layers L2 and L3 via through hole sets TH5 to TH8.

In the case the conductive ground portion L1E and the conductive ground portion L1F are connected by a connecting element CN6, noises supplied from outside of the display through the screw EP1 to the printed circuit board 14 spread to the plurality of conductive ground layers L1 to L3 through routes as shown by an arrow R6. That is, the noises from the screw EP1 spread to the conductive ground portion L1E and further spread to the conductive ground portion L1F via the connecting element CN6. Then, the noises spread in opposite directions along the line A-A' extending to both edge portions of the conductive ground portion L1F. Then, the noises spread in directions along an orthogonal line with respect to line A-A' extending to other edge portions of the conductive ground portion L1F. In the process of noise spreading like this, the noises further spread to other conductive ground layers L2 and L3 via through hole sets TH5 to TH8.

In the case the conductive ground portion L1E and the conductive ground portion L1F are connected by a connecting element CN7, noises supplied from outside of the display through the screw EP1 to the printed circuit board 14 spread to the plurality of conductive ground layers L1 to L3 through routes as shown by an arrow R7. That is, the noises from the screw EP1 spread to the conductive ground portion L1E and further spread to conductive ground portion L1F via the connecting element CN7. Then, the noises spread in opposite directions along an orthogonal line with respect to line A-A' extending to edge portions of the conductive ground portion L1F. Then, the noises spread along line A-A' extending to other edge portions of the conductive ground portion L1F. In the process of noise spreading like this, the noises further spread to the other conductive ground layers L2 and L3 via through hole sets TH5 to TH8.

As shown in FIG. 3, the connecting elements CN4 to CN7 are provided to connect the conductive ground portions L1E and L1F. The connecting elements CN4 to CN7 can be arranged so as to connect adjacent four edges of the conductive ground portions L1E having a rectangular shape and the conductive ground portion L1F.

In the above embodiment, it becomes possible to select some noise spreading routes among the routes R4 to R7. That is, each route R4 to R7 is selected by selectively providing the corresponding connecting element CN4 to CN7. All the connecting elements CN4 to CN7 are provided to connect the conductive ground portions L1E and L1F. However, the location where the connecting elements are located is different among each other. Accordingly, the noise spreading route may change even in the same conductive ground layer in the printed circuit board 14 by selecting which of the connecting elements CN4 to CN7 to put in place. Further, it is possible to make the effect of noises weakened depending on the locations even in the same conductive ground layer of the printed circuit board 14

That is, it becomes possible to make a counter measurement against the noises by attenuating the noises supplied to the printed circuit board 14 corresponding to the circuit elements installed on the printed circuit board 14. For example, the ground noises are substantially synchronized or are made asynchronous with signal noises to attenuate them.

Accordingly, it becomes possible to provide a liquid crystal display device in which an appropriate ground construction used in the liquid crystal display device may be selected corresponding to the electric elements installed on the printed circuit board.

In the embodiments of the invention, the printed circuit board is applied to a liquid crystal display device, however, the embodiments may be applied to other displays other than a liquid crystal display device if such other displays are provided with a printed circuit board having the above ground construction.

In the above embodiments, metal layers such as copper or nickel are used as a connecting element, however, another connecting element, for example, a resistive element, may be used to change the ground construction.

The present invention is not limited directly to the above described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined.

Obviously, numerous modifications and variations of the present invention are possible in light of the above teachings. It is therefore to be understood that within the scope of the appended claims, the invention may be practiced otherwise than as specifically described herein.

What is claimed is:

1. A printed circuit board for mounting electric elements thereon, comprising:
   a ground portion formed on the printed circuit board connected to an outer ground;
   first and second conductive ground layers stacked so as to interpose an insulation layer therebetween, the first conductive ground layer including first, second, and third conductive ground portions, the first and second conductive ground portions having island shapes, respectively, and the third conductive ground portion being adjacent to the first and second conductive ground portions;
   first and second through holes formed in the second and third conductive ground portions, respectively; and
   a connecting element connecting the first conductive ground portion and at least one of the second and third conductive ground portions;
   wherein the first conductive ground portion is coupled to the outer ground and the second conductive ground layer is grounded via the first conductive ground portion and at least one of the second and third conductive ground portions of the first conductive ground layer.

2. The printed circuit board according to claim 1, wherein the printed circuit board further comprises:
   a third conductive ground layer arranged under the second conductive layer and interposing an insulation layer therebetween, and
   wherein the first through hole formed in the second conductive ground portion electrically couples between the second conductive ground portion and at least one of the second and third conductive ground layers.

3. The printed circuit board according to claim 1, wherein the first conductive ground layer further includes a fourth conductive ground portion having an island shape and selectively coupled to the first conductive ground portion by a second connecting element.

4. A printed circuit board for mounting electric elements thereon, comprising:
   a ground portion formed on the printed circuit board connected to an outer ground;
   first and second conductive ground layers stacked so as to interpose an insulation layer therebetween, the first conductive ground layer including first, second, third, and fourth conductive ground portions, the first, second, and third conductive ground portions having island shapes, respectively, and the fourth conductive ground portion being adjacent to the first, second, and third conductive ground portions;
   first, second, and third through holes formed in the second, third, and fourth conductive ground portions, respectively; and
   a connecting element provided so as to selectively connect the first conductive ground portion to the second, third, and fourth conductive ground portions;
   wherein the first conductive ground portion is coupled to the outer ground and the second conductive ground layer is grounded via the first ground portion and at least one of the second, third, and fourth conductive ground portions of the first conductive ground layer.

5. The printed circuit board according to claim 4, wherein the printed circuit board further comprises:
   a third conductive ground layer arranged under the second conductive ground layer so as to interpose an insulation layer therebetween, and
   wherein the first, second, and third through holes are arranged so as to electrically couple the first conductive ground layer to the second and third ground layers.

* * * * *